US011221769B2

(12) United States Patent
Berman et al.

(10) Patent No.: US 11,221,769 B2
(45) Date of Patent: Jan. 11, 2022

(54) PERFORMING NOISE CANCELLATION ON A MEMORY DEVICE USING A NEURAL NETWORK

(71) Applicant: SAMSUNG ELECTRONICS CO., LTD., Suwon-si (KR)

(72) Inventors: Amit Berman, Ramat Gan (IL); Elisha Halperin, Ramat Gan (IL); Evgeny Blaichman, Ramat Gan (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 151 days.

(21) Appl. No.: 16/585,186

(22) Filed: Sep. 27, 2019

(65) Prior Publication Data

US 2021/0096751 A1 Apr. 1, 2021

(51) Int. Cl.

| | |
|---|---|
| ***G06F 12/00*** | (2006.01) |
| ***G06F 13/00*** | (2006.01) |
| ***G06F 13/28*** | (2006.01) |
| ***G06F 3/06*** | (2006.01) |
| ***G06N 3/04*** | (2006.01) |
| ***G06N 3/08*** | (2006.01) |
| *G11C 16/04* | (2006.01) |

(52) U.S. Cl.

CPC .......... *G06F 3/0619* (2013.01); *G06F 3/0659* (2013.01); *G06F 3/0673* (2013.01); *G06N 3/04* (2013.01); *G06N 3/08* (2013.01); *G11C 16/0483* (2013.01)

(58) Field of Classification Search

CPC ....... G06F 3/0619; G06F 3/0614; G06N 3/04; G06N 3/08

USPC .......................................................... 711/154

See application file for complete search history.

(56) References Cited

U.S. PATENT DOCUMENTS

| | | | | |
|---|---|---|---|---|
| 2009/0164871 A1* | 6/2009 | Jo | .......................... | G11C 29/02 714/764 |
| 2012/0182804 A1* | 7/2012 | Hung | ................ | H01L 27/11578 365/185.13 |
| 2018/0349359 A1* | 12/2018 | McCann | .............. | G06N 3/0454 |
| 2020/0210831 A1* | 7/2020 | Zhang | .................. | G11C 29/028 |
| 2020/0285419 A1* | 9/2020 | Ng | ....................... | G06N 3/0481 |

OTHER PUBLICATIONS

Kevin L. Priddy, Artificial Neural Networks An Introduction, Spie press, p. 15 (Year: 2005).*

* cited by examiner

*Primary Examiner* — Edward J Dudek, Jr.
*Assistant Examiner* — Sidney Li
(74) *Attorney, Agent, or Firm* — F. Chau & Associates, LLC

(57) ABSTRACT

A memory system includes a memory device, and a memory controller including a processor and an internal memory. A computer program including a neural network is stored in the memory system. The processor executes the computer program to extract a voltage level from each of a plurality of memory cells connected to one string select line (SSL), in which the memory cells and the SSL are included in a memory block of the memory device, provide the voltage levels as input to the neural network, and perform noise cancellation on the SSL, using the neural network, by changing at least one of the voltage levels from a first voltage level to a second voltage level. The first voltage level is classified into a first cluster of memory cells, and the second voltage level is classified into a second cluster of memory cells different from the first cluster.

20 Claims, 10 Drawing Sheets

| | mean | std |
|---|---|---|
| WL 1 Optimal | 428.5 | 48.6 |
| WL 1 Noised Data | 588.2 | 133.7 |
| WL 1 Predicted | 435.0 | 110.4 |
| WL 2 Optimal | 561.7 | 57.8 |
| WL 2 Noised Data | 706.8 | 167.8 |
| WL 2 Predicted | 562.3 | 105.7 |

PERFORMING NOISE CANCELLATION ON A MEMORY DEVICE USING A NEURAL NETWORK

TECHNICAL FIELD

Exemplary embodiments of the present inventive concept relate to a memory device configured to perform noise cancellation using a neural network, and a method of performing noise cancellation on a memory device using a neural network.

DISCUSSION OF THE RELATED ART

Modern NAND flash memory devices allow for several bits of data to be stored in each memory cell, providing improvements in manufacturing costs and performance. A memory cell in which multiple bits of data are stored may be referred to as a multi-level memory cell. A multi-level memory cell partitions a threshold voltage range of a memory cell into several voltage states, and data values written to the memory cell are extracted using the memory cell voltage levels. However, storing multiple bits per memory cell may decrease the dynamic voltage range of each voltage state, making the memory cells more susceptible to noise.

SUMMARY

According to an exemplary embodiment, a memory system includes a memory device, and a memory controller including a processor and an internal memory. The memory device operates under control of the memory controller. A computer program including a neural network is stored in the internal memory of the memory controller or the memory device. The processor is configured to execute the computer program to extract a voltage level from each of a plurality of memory cells connected to one string select line (SSL), in which the memory cells and the SSL are included in a memory block of the memory device, provide the voltage levels of the memory cells as input to the neural network, and perform noise cancellation on the SSL, using the neural network, by changing at least one of the voltage levels of the memory cells from a first voltage level to a second voltage level. The first voltage level is classified into a first cluster of memory cells, and the second voltage level is classified into a second cluster of memory cells different from the first cluster.

According to an exemplary embodiment, a method of performing noise cancellation on a memory device using a neural network includes extracting a voltage level from each of a plurality of memory cells connected to one string select line (SSL), in which the memory cells and the SSL are included in a memory block of the memory device, providing the voltage levels of the memory cells as input to the neural network, and performing noise cancellation on the SSL, using the neural network, by changing at least one of the voltage levels of the memory cells from a first voltage level to a second voltage level. The first voltage level is classified into a first cluster of memory cells, the second voltage level is classified into a second cluster of memory cells different from the first cluster.

According to an exemplary embodiment, a computer program product for performing noise cancellation on a memory device using a neural network includes a computer readable storage medium having program instructions embodied therewith. The program instructions are executable by a processor to cause the processor to extract a voltage level from each of a plurality of memory cells connected to one string select line (SSL), in which the memory cells and the SSL are included in a memory block of the memory device, provide the voltage levels of the memory cells as input to the neural network, and perform noise cancellation on the SSL, using the neural network, by changing at least one of the voltage levels of the memory cells from a first voltage level to a second voltage level. The first voltage level is classified into a first cluster of memory cells, the second voltage level is classified into a second cluster of memory cells different from the first cluster.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1:
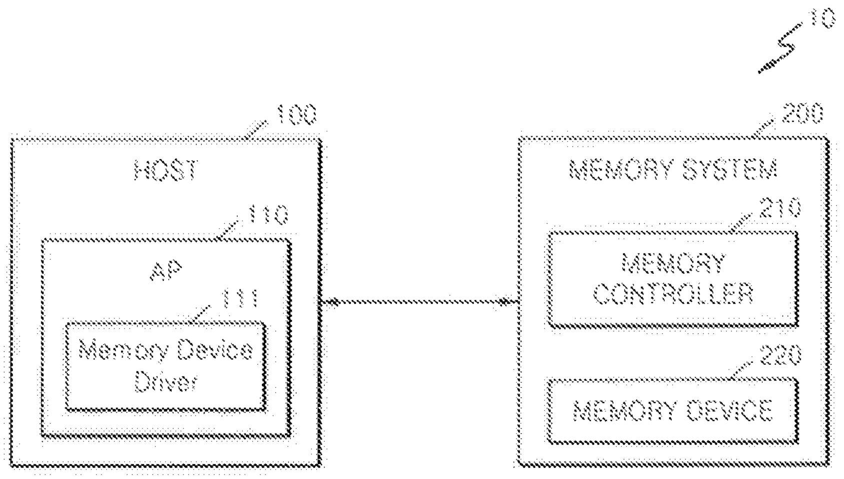
FIG. 1 is a block diagram illustrating an implementation of a data processing system including a memory system, according to an exemplary embodiment of the inventive concept.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a block diagram illustrating an implementation of a data processing system including a memory system, according to an exemplary embodiment of the inventive concept.

Referring to FIG. 1, the data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, exemplary embodiments of the inventive concept will be described as including a memory device that is a non-volatile memory. However, exemplary embodiments are not limited thereto. For example, the memory system 200 may include a memory device that is a volatile memory.

According to exemplary embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device.

Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) mounted on, for example, a mobile device, or a central processing unit (CPU) included in a computer system.

As described above, the host 100 may include an AP 110. The AP 110 may include various intellectual property (IP) blocks. For example, the AP 110 may include a memory device driver 111 that controls the non-volatile memory system 200. The host 100 may communicate with the non-volatile memory system 200 to transmit a command related to a memory operation and receive a confirm command in response to the transmitted command.

The non-volatile memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command, or may provide read data to the memory controller 210 in response to the internal command.

Figure 4:
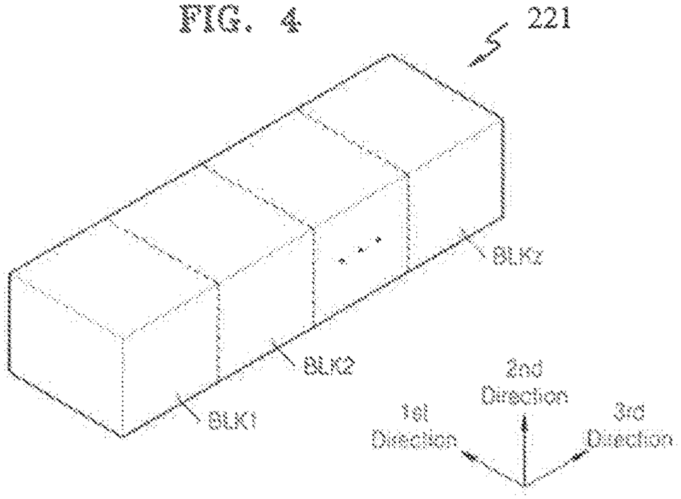
FIG. 4 is a block diagram of the memory cell array of FIG. 2, according to an exemplary embodiment of the inventive concept.

The memory device 220 includes a memory cell array that retains data stored therein, even when the memory device 220 is not powered on. The memory cell array may include as memory cells, for example, a NAND or NOR flash memory, a magnetoresistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
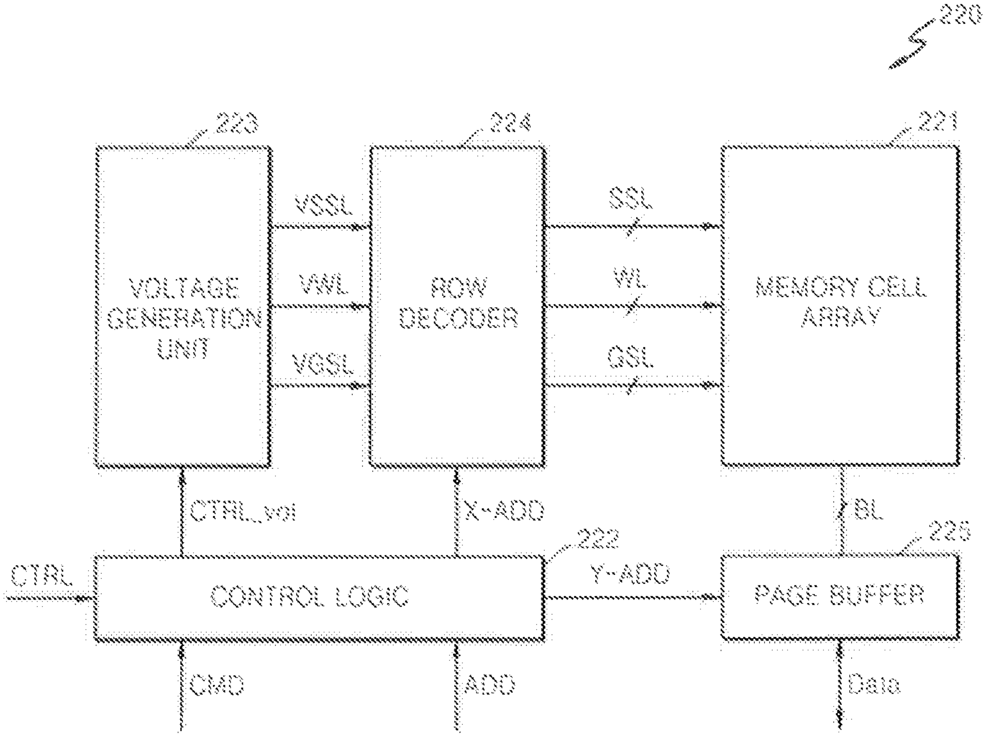
FIG. 2 is a detailed block diagram of a non-volatile memory device of FIG. 1, according to an exemplary embodiment of the inventive concept.

FIG. 2 is a detailed block diagram of the non-volatile memory device 220 of FIG. 1, according to an exemplary embodiment of the inventive concept.

Referring to FIG. 2, the non-volatile memory device 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the non-volatile memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an exemplary embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 3:
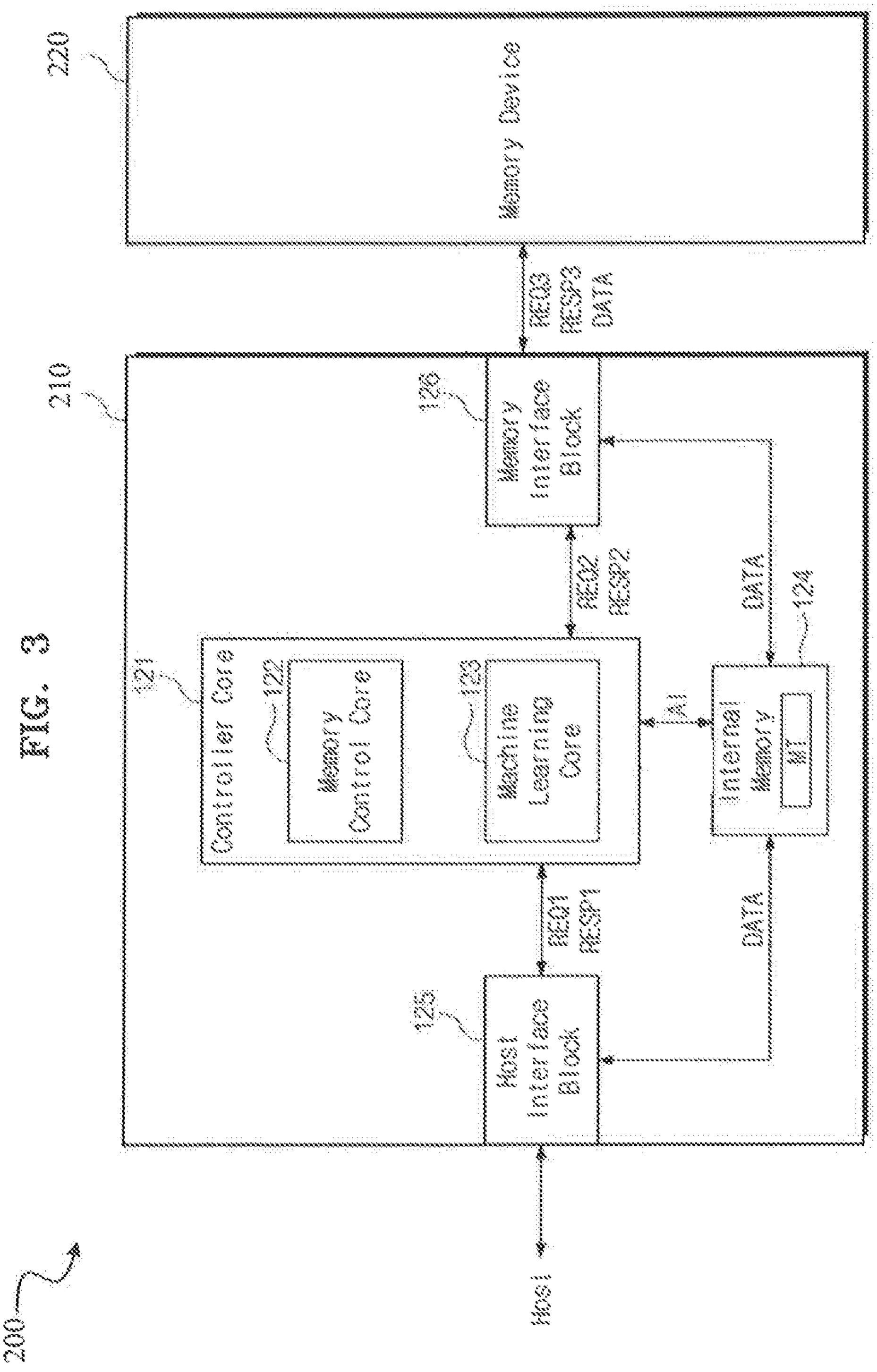
FIG. 3 is a block diagram illustrating the memory system of FIG. 1, according to an exemplary embodiment of the inventive concept.

FIG. 3 is a block diagram illustrating the memory system 200 of FIG. 1, according to an exemplary embodiment of the inventive concept.

Referring to FIG. 3, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 121, an internal memory 124, a host interface block 125, and a memory interface block 126.

The controller core 121 may include a memory control core 122 and a machine learning core 123, and each of these cores may be implemented by one or more processors. The memory control core 122 may control and access the memory device 220 depending on a request received from the host 100 or an internally designated schedule. The memory control core 122 may manage and execute various metadata and codes used to manage or operate the memory system 200.

The machine learning core 123 may be used to perform training and inference of a neural network that is designed to perform noise cancellation on the memory device 220, as described in further detail below.

The internal memory 124 may be used, for example, as a system memory which is used by the controller core 121, a cache memory which stores data of the memory device 220, or a buffer memory which temporarily stores data between the host 100 and the memory device 220. The internal memory 124 may store a mapping table MT that indicates a relationship between logical addresses assigned to the memory system 200 and physical addresses of the memory device 220. The internal memory 124 may include, for example, a DRAM or an SRAM.

In an exemplary embodiment, a neural network, such as the neural network described with reference to FIG. 8, may be included in a computer program which is stored in the internal memory 124 of the memory controller 210 or in the memory device 220. The computer program including the neural network may be executed by the machine learning core 123 to denoise data stored in the memory device 220. Thus, according to exemplary embodiments, the memory system 200 may denoise the data stored in the memory device 220 during a normal read operation of the memory device 220. That is, after manufacture of the memory system 200 is complete, during normal operation of the memory system 200, and particularly, during a normal read operation of the memory system 200 in which data is read from the memory device 220, the data stored in the memory device 220 that is being read may be denoised using the neural network locally stored and executed in the memory system 200, and the denoised data may be read out from the memory device 220.

The host interface block 125 may include a component for communicating with the host 100 such as, for example, a physical block. The memory interface block 126 may include a component for communicating with the memory device 220 such as, for example, a physical block.

Below, an operation of the memory system 200 over time will be described. When power is supplied to the memory system 200, the memory system 200 may perform initialization with the host 100.

The host interface block 125 may provide the memory control core 122 with a first request REQ1 received from the host 100. The first request REQ1 may include a command (e.g., a read command or a write command) and a logical address. The memory control core 122 may translate the first request REQ1 to a second request REQ2 suitable for the memory device 220.

For example, the memory control core 122 may translate a format of the command. The memory control core 122 may obtain address information AI with reference to the mapping table MT stored in the internal memory 124. The memory control core 122 may translate a logical address to a physical address of the memory device 220 by using the address information AI. The memory control core 122 may provide the second request REQ2 suitable for the memory device 220 to the memory interface block 126.

The memory interface block 126 may register the second request REQ2 from the memory control core 122 at a queue. The memory interface block 126 may transmit a request that is first registered at the queue to the memory device 220 as a third request REQ3.

When the first request REQ1 is a write request, the host interface block 125 may write data received from the host 100 to the internal memory 124. When the third request REQ3 is a write request, the memory interface block 126 may transmit data stored in the internal memory 124 to the memory device 220.

When data is completely written, the memory device 220 may transmit a third response RESP3 to the memory interface block 126. In response to the third response RESP3, the memory interface block 126 may provide the memory control core 122 with a second response RESP2 indicating that the data is completely written.

After the data is stored in the internal memory 124 or after the second response RESP2 is received, the memory control core 122 may transmit a first response RESP1 indicating that the request is completed to the host 100 through the host interface block 125.

When the first request REQ1 is a read request, the read request may be transmitted to the memory device 220 through the second request REQ2 and the third request REQ3. The memory interface block 126 may store data received from the memory device 220 in the internal memory 124. When data is completely transmitted, the memory device 220 may transmit the third response RESP3 to the memory interface block 126.

As the third response RESP3 is received, the memory interface block 126 may provide the memory control core 122 with the second response RESP2 indicating that the data is completely stored. As the second response RESP2 is received, the memory control core 122 may transmit the first response RESP1 to the host 100 through the host interface block 125.

The host interface block 125 may transmit data stored in the internal memory 124 to the host 100. In an exemplary embodiment, in the case in which data corresponding to the first request REQ1 is stored in the internal memory 124, the transmission of the second request REQ2 and the third request REQ3 may be omitted.

Figure 5:
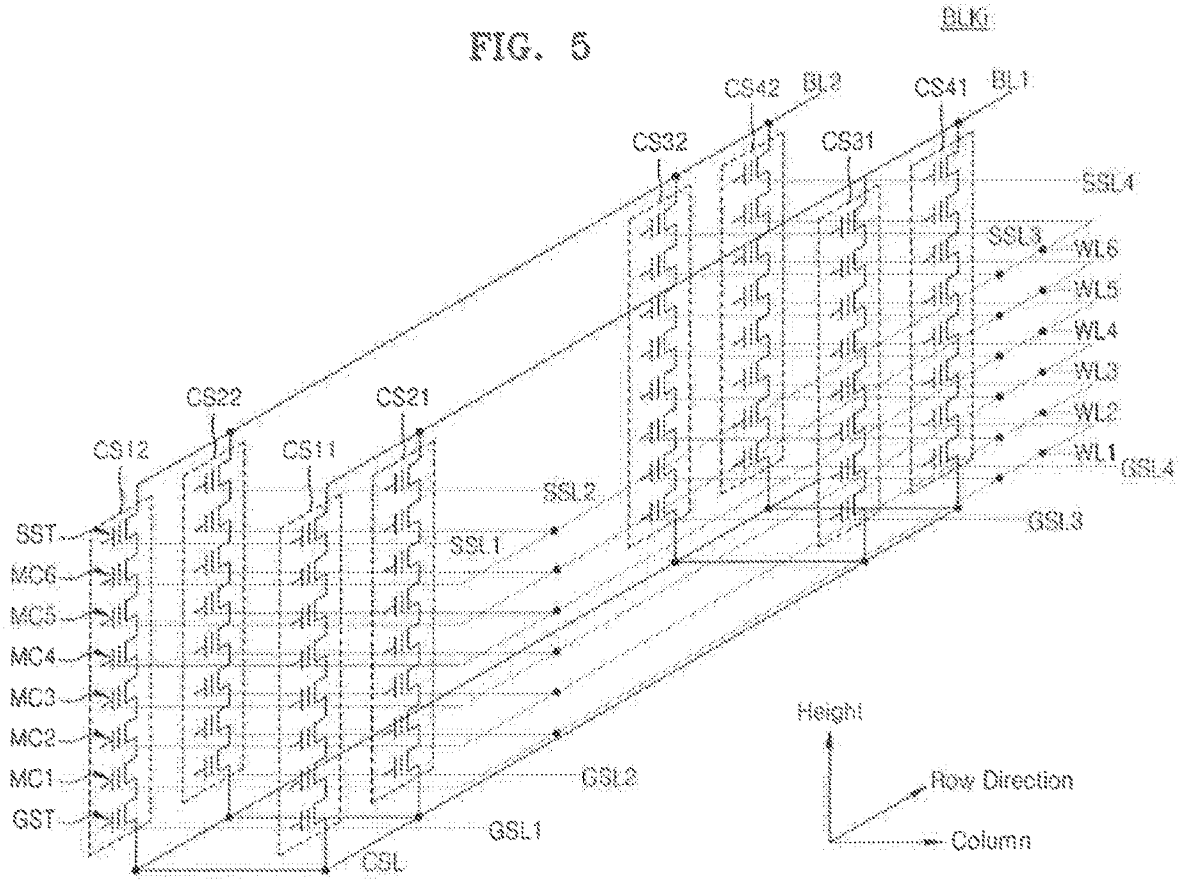
FIG. 5 is a circuit diagram of a memory block of the memory cell array of FIG. 4, according to an exemplary embodiment of the inventive concept.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an exemplary embodiment of the inventive concept.

Referring to FIG. 4, the memory cell array 221 according to an exemplary embodiment includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an exemplary embodiment of the inventive concept. FIG. 5 illustrates an example of one of the memory blocks BLK1 to BLKz in the memory cell array 221 of FIG. 4.

The memory block BLKi may include a plurality of cell strings CS11 to CS41 and CS12 to CS42. The plurality of cell strings CS11 to CS41 and CS12 to CS42 may be arranged in column and row directions to form columns and rows. Each of the cell strings CS11 to CS41 and CS12 to CS42 may include a ground select transistor GST, memory cells MC1 to MC6, and a string select transistor SST. The ground select transistor GST, the memory cells MC1 to MC6, and the string select transistor SST, which are included in each of the cell strings CS11 to CS41 and CS12 to CS42, may be stacked in a height direction substantially perpendicular to a substrate.

The columns of the plurality of cell strings CS11 to CS41 and CS12 to CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11 to CS41 and CS12 to CS42 may be connected to different bit lines BL1 and BL2, respectively. For example, the string select transistors SST of the cell strings CS11 to CS41 may be commonly connected to the bit line BL1. The string select transistors SST of the cell strings CS12 to CS42 may be commonly connected to the bit line BL2.

The columns of the plurality of cell strings CS11 to CS41 and CS12 to CS42 may be connected to different ground select lines GSL1 to GSL4, respectively. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The memory cells disposed at the same height from the substrate (or the ground select transistors GST) may be commonly connected to a single word line, and the memory cells disposed at different heights from the substrate may be connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6. The ground select transistors GST of the cell strings CS11 to CS41 and CS12 to CS42 may be commonly connected to the common source line CSL.

Figure 6:
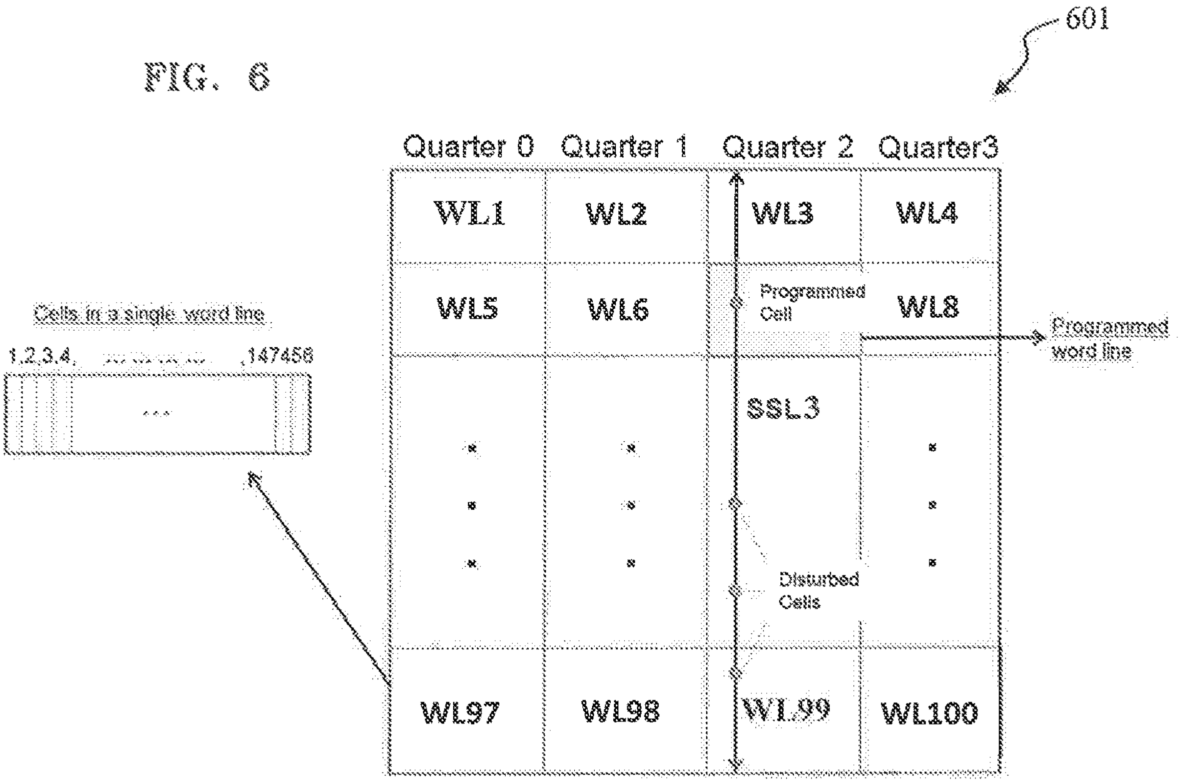
FIG. 6 is a block diagram illustrating disturbances that may occur when programming a word line of a memory block.

FIG. 6 is a block diagram illustrating disturbances that may occur when programming a word line of a memory block.

When storing multiple number of bits in a single memory cell, program noise may cause errors with the stored data. For example, in a VNAND memory device, when one word line is being programmed (written to), this programming may cause noise to occur on neighboring word lines, which may cause errors later when those word lines are read. A particularly strong noise may be generated by memory cells located geometrically one above another (e.g., memory cells located in the same pillar or column).

Examples will be described herein with reference to FIGS. 6-11 in which 6 bits per cell (6 BPC) are written over an entire memory block. However, it is to be understood that exemplary embodiments are not limited thereto. For example, exemplary embodiments may be applied to a 5 bits per cell (5 BPC) or 4 bits per cell (4 BPC) scheme.

In a 6 BPC scheme, one memory cell holds the information of 6 bits when its state (e.g., the voltage the memory cell contains) belongs to one of $2^6$=64 states (a state for every combination of 0's and 1's of the 6 bits). That is, there are 64 possible states for each memory cell in a 6 BPC scheme, in which each state corresponds to one of 64 predefined voltage levels. As a result, the memory cells are naturally clustered into 64 different clusters, in which each cluster is characterized by a voltage level that all memory cells in that cluster share. A cluster of memory cells containing the same voltage may be referred to as a logical entity called a level (also referred to hereinafter as a memory cell level). The memory cells included in the same cluster (in the same memory cell level) may have substantially the same voltage levels as one another. For example, in a 6 BPC scheme, since there is a relatively small voltage window for each of the 64 levels required to maintain the 6 BPC scheme (e.g., about 120 mV per level), the difference between voltage levels classified into the same cluster may generally be less than about 120 mV.

Since each word line WL is physically connected to a plurality of different memory cells each having one of 64 voltage levels, each word line WL can be described as having 64 voltage levels. Thus, a word line WL may have 64 different voltage levels in a 6 BPC scheme ($2^6$=64), 32 different voltage levels in a 5 BPC scheme (25=32), or 16 different voltage levels in a 4 BPC scheme (24=16). The probability of leakage from one level to another, and thus, the probability of errors occurring, increases as the voltage levels become more densely packed. Thus, there is a higher chance of errors occurring in a 6 BPC scheme than in a 5 BPC or 4 BPC scheme.

Since the memory cells are clustered by their voltage, and since that voltage may change due to interferences of various kinds, some memory cells may change their voltage by an amount large enough to cause misclassification (i.e., some memory cells may be grouped into the wrong cluster since they are now closer to the voltage level of that cluster than to their own correct voltage). Since the level (i.e., cluster) corresponds to the memory cell's assumed state (and thus its bit content), a misclassified memory cell's content will be misread, causing errors. Thus, exemplary embodiments attempt to correct the voltage of such a memory cell when that memory cell is being read so as to reduce the amount of misclassifications that occur. Exemplary embodiments accomplish this by utilizing a neural network that attempts to classify errant memory cells back to their intended clusters by fixing the error in their voltage during a memory read operation.

Memory cells storing the same bit information are programmed to have approximately the same voltage level, and are grouped/clustered together in the same level of the memory block 601. Thus, each word line WL contains memory cells grouped together by their voltage into 64 distinct groups (voltage levels). Referring again to FIG. 5, each string select line is connected to a plurality of cell strings. For example, string select line SSL1 is connected to cell strings CS11 and CS12, string select line SSL2 is connected to cell strings CS21 and CS22, etc. Thus, one string select line is connected to a plurality of different memory cells of different levels. As an example, string select line SSL1 may be connected to a memory cell MC1 of WL1 which may contain a voltage grouping it into level 6, then may be connected to a memory cell MC1 of WL2 which may contain a different voltage grouping it into level 2, etc.

Writing 6 bits per cell over an entire memory block involves many writing operations. During the programming process, subsequent programming pulses may cause noise that significantly disturbs memory cells previously programmed by earlier programming pulses. This noise may severely limit the effectiveness of block programming. Such noise is typically not linear in nature. Rather, such noise is typically iteratively applied (with each new programming pulse), thus making it difficult to probabilistically model.

Exemplary embodiments of the inventive concept are directed to implicitly modeling, and later cancelling, this noise, using machine and deep learning tools. For example, exemplary embodiments may model and cancel this noise using a neural network, which is trained offline using supervised learning. The neural network may be trained based on the BPC scheme utilized by the memory device. For example, since the data distribution is different in each of a 6 BPC scheme, a 5 BPC scheme, and a 4 BPC scheme, the neural network may be trained differently to process data stored according to a 6 BPC scheme, a 5 BPC scheme, or a 4 BPC scheme. Exemplary embodiments may be implemented during reading operations to obtain a more accurate reading of the voltage levels of the memory cells. After the inaccurate (e.g., noised) voltage measurements of the memory cells are read, at least some of the noise causing the inaccuracies is cancelled before the memory cells are clustered to their respective voltage levels. The clustered cells may then be translated into digital data and output by the memory device when data corresponding to the cells is read out from the memory device. Exemplary embodiments may utilize a deep residual network, as well as additional preprocessing and postprocessing algorithms, to cancel this noise, as described in further detail below.

Although the example of FIG. 6 illustrates 100 word lines WL, exemplary embodiments are not limited thereto. For example, exemplary embodiments may be utilized in a memory device having 128 or 256 word lines, or another number of word lines that is divisible by 4.

Referring to FIG. 6, in an exemplary embodiment, a single memory block 601 in which 6 bits per cell are to be written is divided into four quarters, each including 25 vertically stacked word lines WL (see word lines WL1 to WL100). The word lines in each quarter are connected to one string select line SSL. For example, word lines WL1, WL5 . . . WL97 are connected to a first string select line SSL1, word lines WL2, WL6 . . . WL98 are connected to a second string select line SSL2, word lines WL3, WL7 . . . WL99 are connected to a third string select line SSL3, and word lines WL4, WL8 . . . WL100 are connected to a fourth string select line SSL4. In FIG. 6, for convenience of illustration, some word lines and string select lines are not explicitly labelled. However, the locations of these word lines and string select lines is clear with relation to the labelled word lines and string select lines.

To write to the memory block 601, the word lines WL1 to WL100 are consecutively written to by applying programming pulses to the memory cells in the word lines until all of the memory cells have their correct voltage levels. During this writing process, whenever a target memory cell is being programmed, voltage leakage may occur, and all other memory cells on the same string select line SSL as the target memory cell may be disturbed by noise. This noise may result in the voltage level of other previously programmed memory cells on the string select line SSL changing, which may cause additional errors later when these memory cells are read, as described above.

For example, as shown in FIG. 6, word lines WL3, WL7 . . . WL99 are connected to the same string select line SSL3. When the word line WL7 is being programmed (written to) ("Programmed word line" in FIG. 6), a memory cell connected to the word line WL7 is programmed ("Programmed Cell" in FIG. 6). This programmed memory cell is the target memory cell in the example of FIG. 6. When the target memory cell connected to both the word line WL7 and the string select line SSL3 is programmed, all other memory cells connected to the same string select line SSL3 may be disturbed by noise ("Disturbed Cells" in FIG. 6). For example, programming the target memory cell may cause a particularly large disturbance to its neighbors when the target memory cell is being programmed to a high voltage level while the neighboring memory cells (e.g., the disturbed cells) on the same string select line SSL3 have low voltage levels.

When disturbances repeatedly occur, for example, as a result of programming many word lines WL of the memory block 601, these disturbances may result in a voltage shift as large as several hundred millivolts. In some outlier cases, an even larger voltage shift may occur. Since there is a relatively small voltage window for each of the 64 levels required to maintain a 6 BPC scheme (e.g., about 120 mV per level), such disturbances may render entire levels of the memory cell array 221 unreadable, which may cause a significant amount of errors when data is read from the memory cell array 221. Exemplary embodiments of the inventive concept address this problem by, during a memory read operation, attempting to restore each word line WL to its respective state it was in after the word line WL was programmed and before the programming of neighboring word lines WL caused a disturbance. For example, each word line WL may be restored during a memory read operation by decoding the memory cells back into the information bits they hold. Thus, in exemplary embodiments, memory cells may be denoised during a memory read operation to correct errors that previously occurred during a memory write operation.

Figure 7:
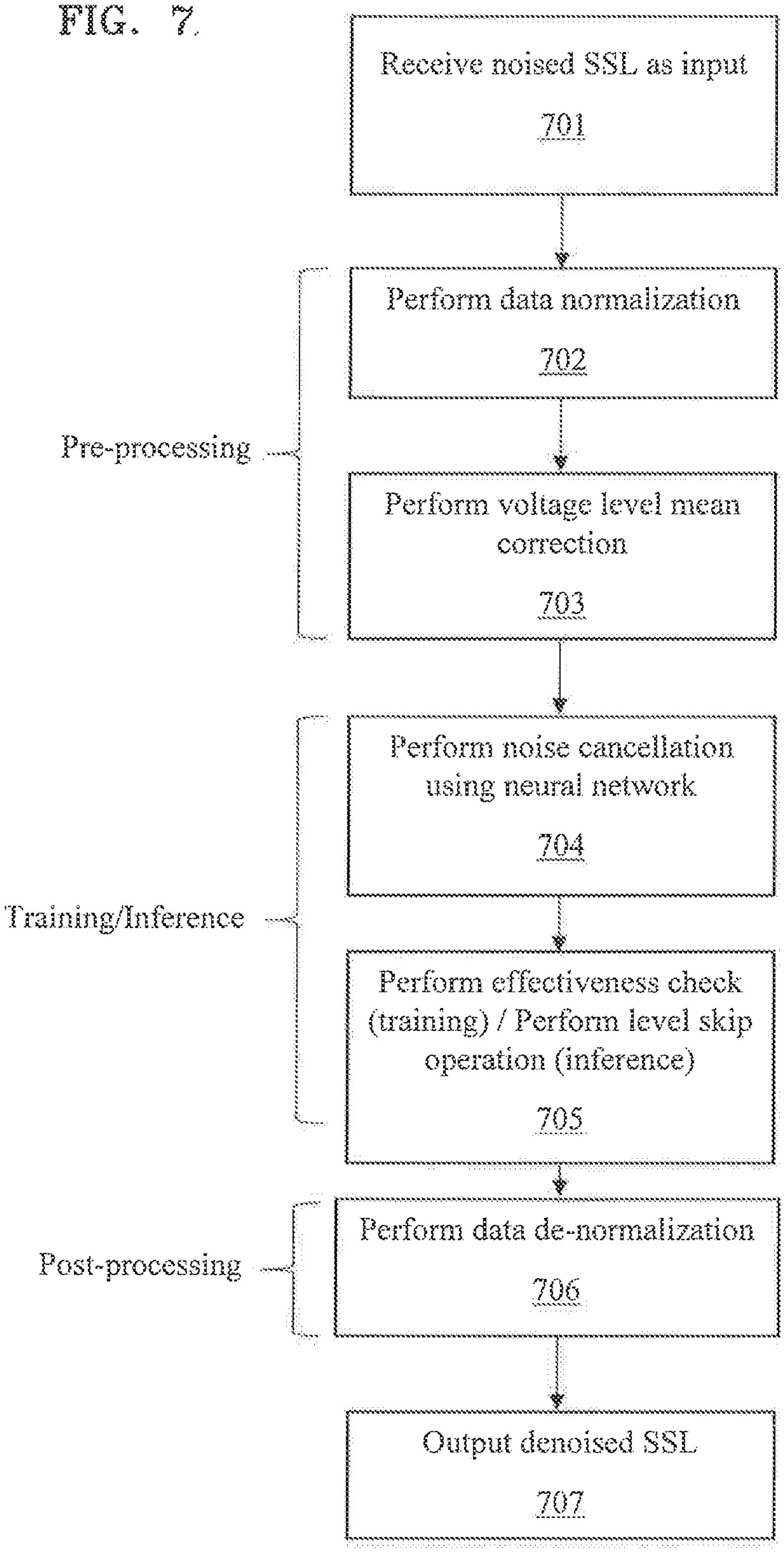
FIG. 7 is a flowchart illustrating an overview of a successive noise cancellation process performed on a memory block, according to an exemplary embodiment of the inventive concept.

FIG. 7 is a flowchart illustrating an overview of a successive noise cancellation process performed on a memory block, according to an exemplary embodiment of the inventive concept.

The successive noise cancellation process illustrated in FIG. 7 is performed during the memory block reading stage, and may correct errors caused during the memory block writing stage. The successive noise cancellation process accepts a noised memory block as its input, and then returns a cleaned memory block (a denoised memory block) as its output. The cleaned memory block is returned on a per-SSL basis, as described further below. In a 6 BPC scheme, the outputted denoised memory block can then be read as 6*n_wls pages of bits, where n_wls is the number of word lines in the memory block.

Algorithm 1, shown below, corresponds to the flowchart of FIG. 7, and describes how each of operations 701 to 707 of FIG. 7 may be implemented according to an exemplary embodiment. The values used in Algorithm 1 correspond to a 6 BPC scheme. For example, X in Algorithm 1 corresponds to the noised SSL received as input in operation 701, (1) in Algorithm 1 corresponds to operation 702, (2) in Algorithm 1 corresponds to operation 703, (3) in Algorithm 1 corresponds to operation 704, (4) in Algorithm 1 corresponds to operation 705, (5) in Algorithm 1 corresponds to operation 706, and $\hat{X}$ in Algorithm 1 corresponds to the denoised SSL output in operation 707.

Algorithm 1:

- X - Noisy data - 25 wordlines X 147456 cells matrix
- $M_i$ - Constant mean of level i $0 \le i < 64$ 1. Data Normalization
   (a) $X = (X + 2500) / (6500 + 2500) * 2 - 1$
2. Level Mean Correction
   (a) $T_i$ = threshold of levels i, i + 1 $0 \le i < 64$
   (b) $L_i = level_i = \{x | T_{i-1} \le x < T_i, x \in X\}$
   (c) $\mu_i = mean(L_i)$
   (d) $L_i = L_i - (\mu_i - M_i) = \{x - (\mu_i - M_i) | x \in L_i\}$
3. ResNet Noise Cancellation
   (a) $\hat{X} = ResNet(X)$
4. Skip by Wordline and Level
   (a) for $W\hat{\ }L_j$ in $\hat{X}$
      i. for $\hat{L}_k$ in $W\hat{\ }L_j$
      A. if $BER(\hat{L}_k) > BER(L_k)$
      B. $\hat{L}_k = L_k$
5. Data De-normalization
   (a) $\hat{X} = (\hat{X} + 1) / 2 * (6500 + 2500) - 2500$
6. return $\hat{X}$ Referring to FIG. 7, operations 702 and 703 belong to a pre-processing stage of the noise cancellation method, operations 704 and 705 belong to a training/inference stage of the noise cancellation method, and operation 706 belongs to a post-processing stage of the noise cancellation method.

In operation 701, a noised SSL on which successive noise cancellation is to be performed is read and provided as input for a neural network, which performs noise cancellation. That is, in operation 701, the voltage levels of the memory cells connected to the noised SSL are received as input. In a 6 BPC scheme, Algorithm 1 is executed independently for four SSLs (one time for each SSL in the memory block), as described further below. Algorithm 1 may be executed on the four SSLs independently in parallel or sequentially. Thus, a noised memory block is considered to be denoised once each of the four SSLs (in a 6 BPC scheme) in the memory block is received as input and denoised. The neural network is described in further detail below with reference to FIG. 8. For example, the voltage levels of the memory cells connected to the noised SSL on which successive noise cancellation is being performed may be read and extracted from the noised SSL, and provided as inputs for the neural network in operation 701. In an exemplary embodiment, the value of each of the voltage levels of the memory cells may be between about −3,000 mV and about 6,000 mV.

Referring to FIGS. 6 and 7, in operation 701, in an exemplary embodiment, each of the string select lines SSL1, SSL2, SSL3 and SSL4 is connected to a group of word lines, and each of the string select lines SSL1, SSL2, SSL3 and SSL4 is processed independently to denoise the word lines (and the memory cells) it contains. For example, to perform the noise cancellation method on the memory block 601, operations 702 to 706 (operations 1 to 5 in Algorithm 1) may be performed 4 times consecutively on the string select lines SSL1 to SSL4. The memory block 601 is finally considered to be denoised once each of the string select lines SSL1 to SSL4 has been denoised. For example, operations 702 to 706 may first be performed on SSL1 connected to Quarter 0, then on SSL2 connected to Quarter 1, then on SSL3 connected to Quarter 2, and then on SSL4 connected to Quarter 3. Thus, the width of the input for the neural network is equal to the number of word lines WL connected to a single string select line SSL (e.g., the number of word lines WL in the memory block divided by 4) (e.g., 25 in FIG. 6).

In operation 702, the data received in operation 701 is normalized before being provided as inputs to the neural network. For example, each of the voltage levels of the memory cells connected to the input SSL and extracted in operation 701 may be normalized in operation 702, such that there are fixed upper and lower limits on the inputs received by the neural network. Normalization of the voltage levels may allow the data to fit better within the neural network used to perform noise cancellation. In an exemplary embodiment, all voltage levels of the memory cells received as inputs (via the input SSL) in operation 701 are normalized to the range of [−1, 1]. However, exemplary embodiments are not limited thereto.

In operation 703, voltage level mean correction is performed. That is, mean correction is performed on the normalized voltage levels. For example, the shift of the mean of the normalized voltage levels is compensated for, allowing the voltage levels to be provided as inputs to the neural network. As a result of performing mean correction on the normalized voltage levels, when the voltage levels are provided to the neural network as inputs, the neural network in exemplary embodiments needs only to learn to correct the deviation of the voltage levels.

In an exemplary embodiment, voltage level mean correction is performed using a predefined table(s) including values of the means of the voltage levels of a clean (a denoised) memory block. The size of the table may be n_wls*n_levels, where n_wls is the number of word lines, n_levels is the number of levels, and each memory cell (i,j) contains the estimated placement of the mean of level j in word line i. Values of a clean version of a noised memory block may be estimated by averaging many different memory blocks. In an exemplary embodiment, changes to the memory block over time may be taken into consideration. Every word line WL in the noised memory block may be segmented into 64 voltage levels (in a 6 BPC scheme), and the estimated noise levels may be moved so that their mean values and the clean predefined mean values coincide. Performing voltage level mean correction may greatly reduce the overall shift of many memory cells by bringing their estimated mean value to within a few tens of millivolts of the clean mean value, thus improving the ability of the neural network to learn.

For example, in operation 703, the mean of the noised voltage level distribution is corrected to be as close as possible to the original (clean) voltage level distribution mean. This allows the neural network to focus on reducing the variance of the noise with only minor corrections to the mean. For example, the noised voltage level distribution is corrected to be closer to where it would be if there were no noise, since this distance correction is common to all memory cells in the level. As a result, the neural network can perform noise cancellation by learning only the memory cell specific noise.

Even if the voltage level mean correction performed in operation 703 is not exact, most of the difference between the means can still be cancelled. As a result, the neural network may work less, for example, by focusing on fine-grained details instead of spending time on coarse differences, to bring each memory cell to its correct (clean) position. As a result, the accuracy and precision of the noise cancellation may be improved. For example, if the difference of means between the clean level data and the noised level data is 150 mV, and is corrected to −10, performance and efficiency of the neural network will increase, since the neural network will only have to correct about (10+noise_std) mV instead of (150+noise_std) mV per memory cell.

In operation 704, noise cancellation is performed using a neural network. The neural network may be, for example, a residual neural network (ResNet). The ResNet may cancel the noise present in the inputted data and return a clean (denoised) memory block.

Noise cancellation may be performed based on deep learning using a database. Deep learning is a sub-concept of machine learning, and is a type of neural network model of machine learning which relates to artificial intelligence. Various neural network architectures may be used for deep learning. For example, an artificial neural network (ANN), a deep neural network (DNN), a convolutional neural network (CNN), a recurrent neural network (RNN), and a generative adversarial network (GAN) may be used for deep learning. However, network architectures that may be used for deep learning are not limited thereto.

Performing noise cancellation using a neural network as implemented in operation 704 is described in further detail below with reference to FIG. 8.

Referring to operation 705, although performing noise cancellation on the memory block may provide an improvement in the bit error rate (BER) for some memory cells, it is possible that performing noise cancellation may have no effect on other memory cells, or may actually cause the BER for other memory cells to get worse. In operation 705, an effectiveness check is performed during training, and a level skip operation, which is based on the results of the effectiveness check, is performed during inference.

For example, during training, an effectiveness check may be performed to determine for which levels on which word lines WL noise cancellation improved the BER, and for which levels on which word lines WL noise cancellation did not improve the BER or made the BER worse. The effectiveness check may be implemented by checking every level on each word line WL, and comparing the BER of each level prior to performing noise cancellation with the BER after performing noise cancellation. This analysis can be made since, during training, the true values of the voltage levels of the memory cells are known. The results of the effectiveness check may be saved, for example, in a table(s), and are used during inference to perform a level skip operation.

Still referring to operation 705, during inference, a level skip operation is performed based on the results of the effectiveness check. In the level skip operation, voltage levels that have been made worse by the noise cancellation performed during operation 704 are reverted back to their original, noised state before being read out from the memory device. That is, the voltage levels of the memory cells belonging to the levels on the word lines WL for which BER is not improved (or is made worse) are reverted back to their pre noise cancellation voltage levels before being read out from the memory device. Thus, exemplary embodiments only apply noise cancellation when such application is likely to provide positive results, and refrain from applying noise cancellation when such application would not improve the results or would make the results worse.

In operation 706, data de-normalization is performed to convert the cleaned (denoised) data from the range of [−1, 1] back to the original range (e.g., [−3,000, 6,000]).

In operation 707, a denoised version of the SSL input in operation 701 is output by the neural network. The denoised version of the SSL output by the neural network may be used when data corresponding to the SSL is output by the memory device (e.g., read from the memory device), as described in further detail below with reference to FIG. 8.

The memory block 601 is considered to be denoised once each SSL in the memory block (e.g., SSL1 to SSL4 in FIG. 6) has been denoised.

In exemplary embodiments, operations 702 and 706, and/or operation 703 may be omitted.

Figure 8:
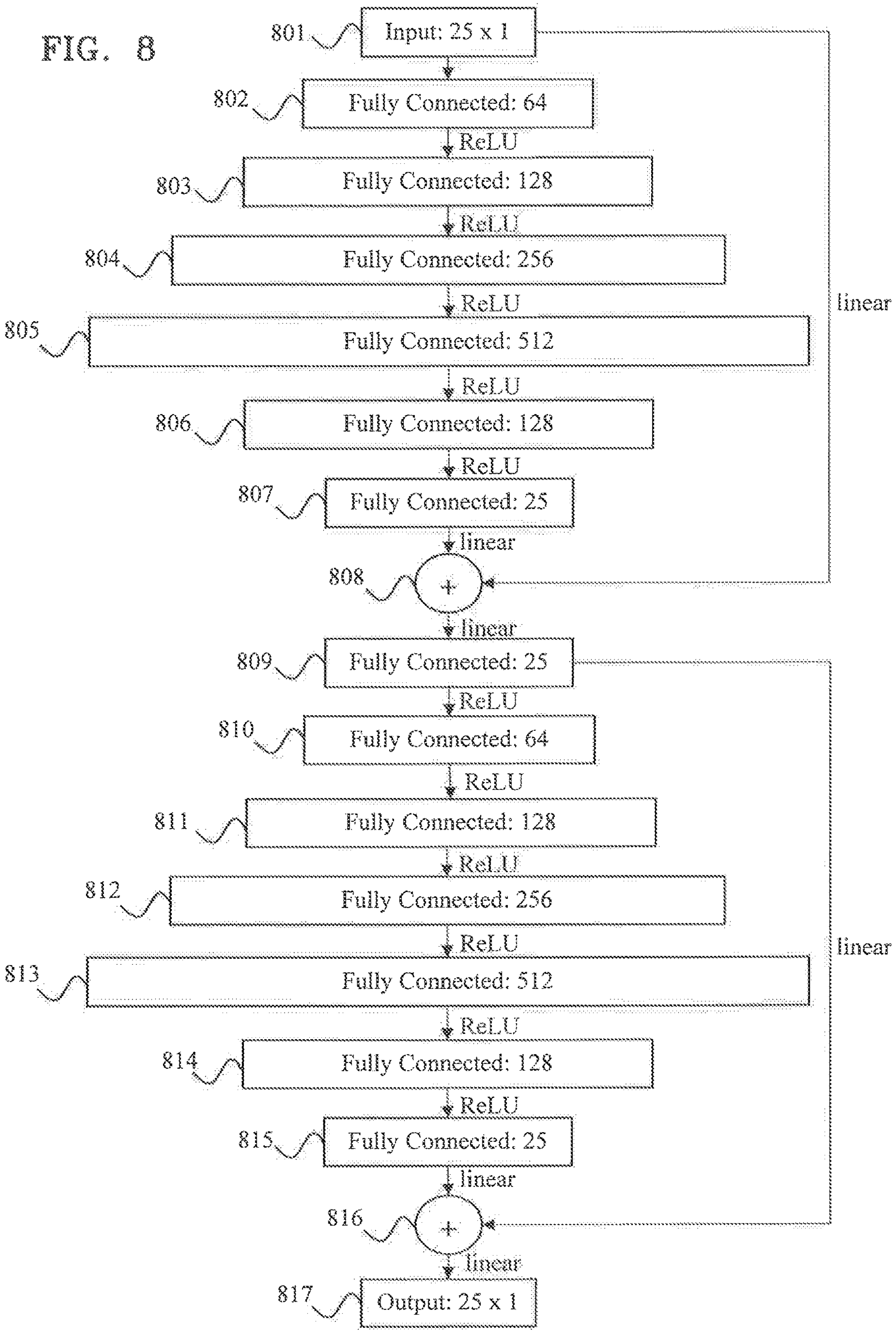
FIG. 8 is a diagram illustrating the structure of a residual neural network (ResNet) used to perform noise cancellation, according to an exemplary embodiment of the inventive concept.

FIG. 8 is a diagram illustrating the structure of a neural network used in operation 704 of FIG. 7, and more particularly, the structure of a residual neural network (ResNet), according to an exemplary embodiment of the inventive concept.

In exemplary embodiments, the noise cancellation performed in operation 704 of FIG. 7 is performed using a ResNet having several identical consecutive residual blocks. An example of such a ResNet is shown in FIG. 8. This configuration allows for an iterative noise cancellation process to be performed, in which only the noise is learned (e.g., in which only the difference between the clean data and the noised data is learned). For example, the ResNet may learn to successively denoise the data, learning only the noise delta of each iteration.

The input for the ResNet is a single noised SSL (e.g., one of SSL1, SSL2, SSL3 and SSL4 illustrated in FIG. 6), and the output is the denoised SSL. Since exemplary embodiments utilize a single SSL each time when performing noise cancellation, only the loss in voltages (the distance between the noised cell voltage and the clean cell voltage) is measured in exemplary embodiments. However, since the raw BER is a non-monotonic measure relative to voltage distance, measuring only the loss in voltage allows for the raw BER to be reduced or minimized.

In FIG. 8, the number in each layer 801-807, 809-815 and 817 indicates the number of neurons in that layer. The indication "x1" in the input layer 801 and the output layer 817 indicates the shape of these layers. For example, each of the input layer 801 and the output layer 817 includes 25 neurons shaped as a vector of 25. The width of the input layer is equal to the number of word lines WL connected to a single string select line SSL (e.g., the number of word lines WL in the memory block divided by 4) (e.g., 25 in a 6BPC scheme as illustrated in FIG. 6). The input layer 801 corresponds to the noised SSL fed into the neural network for denoising.

The type of each layer in the neural network is a fully connected layer. That is, each neuron in each layer connects to each neuron in the next layer. The connections between these neurons have corresponding weights, which are learned during training. When each layer is filled by some input from the previous layer, it multiplies the input by some weight, and then performs a non-linear operation (e.g., a Rectified Linear Unit (ReLU) function) before sending the results as input for the next layer.

The arrows between layers indicate the type of activation function used for the neurons in that layer. In exemplary embodiments, a Rectified Linear Unit (ReLU) function, which is a non-linear function, is used as the activation function between layers 802 and 803, 803 and 804, 804 and 805, 805 and 806, 806 and 807, 809 and 810, 810 and 811, 811 and 812, 812 and 813, 813 and 814, and 814 and 815. The ReLU activation function determines whether a neuron should be activated by calculating a weighted sum of its input and adding a bias, thus, introducing non-linearity into the output of the neuron. A linear function is used as the activation function between layer 801 and operation 808, layer 807 and operation 808, operation 808 and layer 809, layer 809 and operation 816, layer 815 and operation 816, and operation 816 and layer 817. That is, between these layers and operations, no non-linear activation function is performed.

Operation 808 sums the output of layer 807 with the input layer 801, and feeds this output to layer 809. Operation 816 sums the output of layer 815 with layer 809, and feeds this output to the output layer 817. The output layer 817 outputs the denoised SSL.

The denoised SSL output by the output layer 817 may be used when data is output from the memory device (e.g., read from the memory device). For example, referring to FIG. 6, assume that data stored in a memory cell connected to SSL3 (e.g., one of memory cells of word lines WL3, WL7, . . . WL99) is being read out from the memory device. The data may be read out from the memory device, for example, when accessed by a user, when being passed to a subsequent stage of data processing, etc. When the data is read out from the memory device, the operations described above with reference to FIG. 7 may be performed to denoise the data (e.g., to correct the data) before the data is read out from the memory device.

For example, when data is requested to be read from one of memory cells of word lines WL3, WL7, . . . WL99, SSL3 is first denoised by the neural network by changing the voltage level of at least one of the memory cells of word lines WL3, WL7, . . . WL99 from a first voltage level to a second voltage level, in which the first voltage level is classified as belonging to a first cluster (of 64 clusters in a 6 BPC scheme) and the second voltage level is classified as belonging to a second cluster (of 64 clusters in a 6 BPC scheme).

It is to be noted that the voltage levels of such memory cell are not actually changed within the memory device at this time, since writing to the memory cells would re-introduce the noise for the same reasons described above. Rather, the changed (corrected) voltage levels of such memory cells output by the neural network are output by the memory device at the time that data from such memory cells is read out from the memory device, instead of the actual voltage levels of such memory cells within the memory device being read out at this time. That is, the cleaner, denoised version of the data generated by the neural network is output by the memory device, while the noised version of the data actually stored in the memory device is untouched and remains the same within the memory device. Thus, this process may be performed again each time this data is read out from the memory device.

The level skip operation 705 described above with reference to FIG. 7 may be performed when reading out data from the memory device such that voltage levels that have been made worse by noise cancellation are not changed when read out from the memory device (e.g., the actual, unchanged voltage levels in the memory device may be read out for these memory cells). The cleaner, denoised version of the data (as well as any data intentionally left unchanged according to the level skip operation 705) may be translated into digital form before being read out from the memory device.

Since BER is determined by the Grey Code mapping of levels to bits, in some cases, reducing voltage error can potentially increase the number of wrong bits per cell. Accordingly, exemplary embodiments may approximate the BER loss on the range at which it is still monotone and had a constant loss otherwise. For example, according to exemplary embodiments, the loss function may be the normalized tanh (|x-y|/1220), and relative to voltage distance as shown in FIG. 9, approximating linear loss over two level distance, and then constant.

Figure 9:
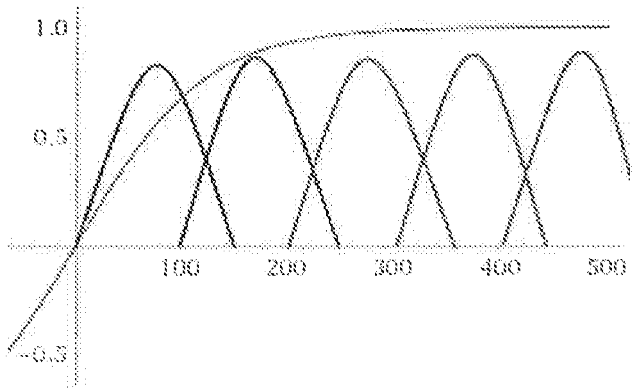
FIG. 9 is a graph illustrating a loss function relative to a voltage distance with relation to a ResNet, according to an exemplary embodiment of the inventive concept.

For example, the graph in FIG. 9 shows the behavior of a loss function according to exemplary embodiments relative to the distribution of the levels in a word line. For example, the loss function may pay attention (i.e., increase the loss) for small distances (up to two levels apart), and fix the loss from that point on (i.e., by treating errors of distance of more than two levels as capped by the distance of two levels). This forces the neural network to improve on small errors where any correction will translate to an improvement in BER, and not to pay as much attention to large errors, since correcting such large errors is not guaranteed to help with BER because it is not a monotonic function.

Figure 10:
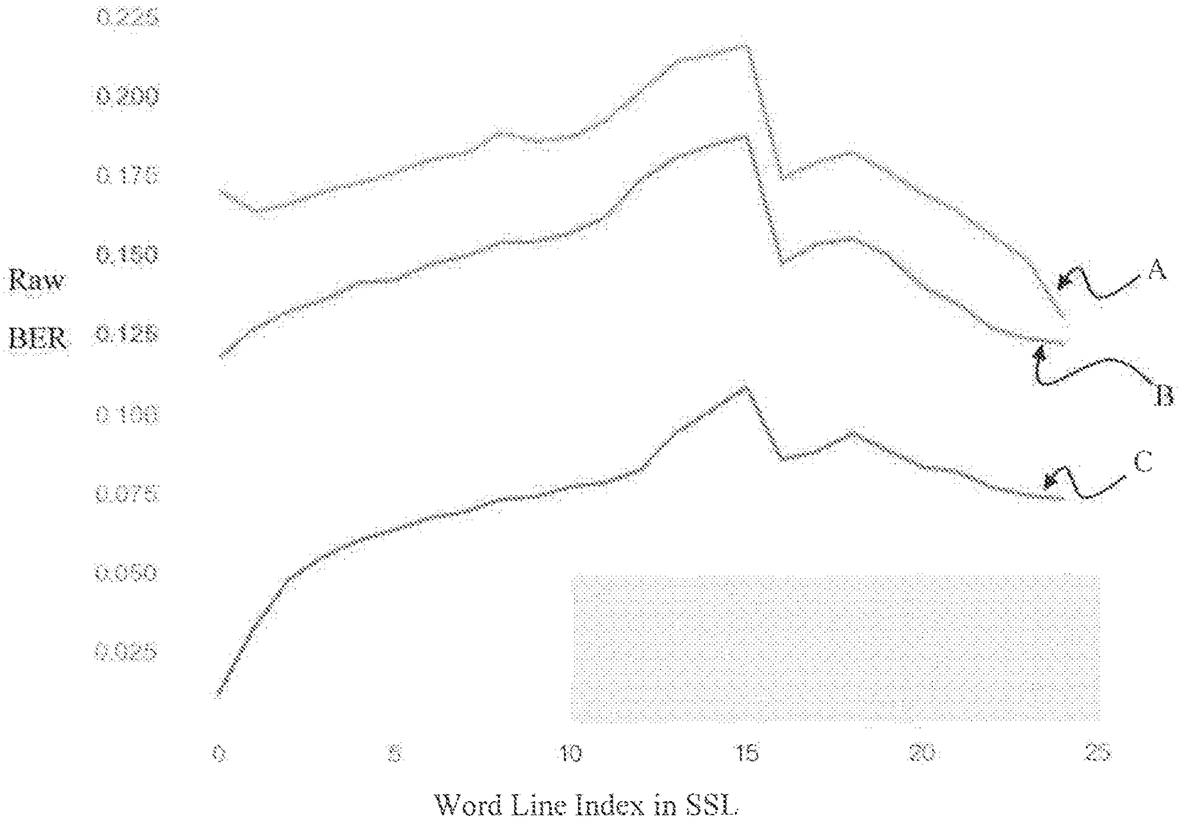
FIG. 10 is a graph illustrating results of performing noise cancellation on a memory device using a neural network, according to an exemplary embodiment of the inventive concept.
Figure 11:
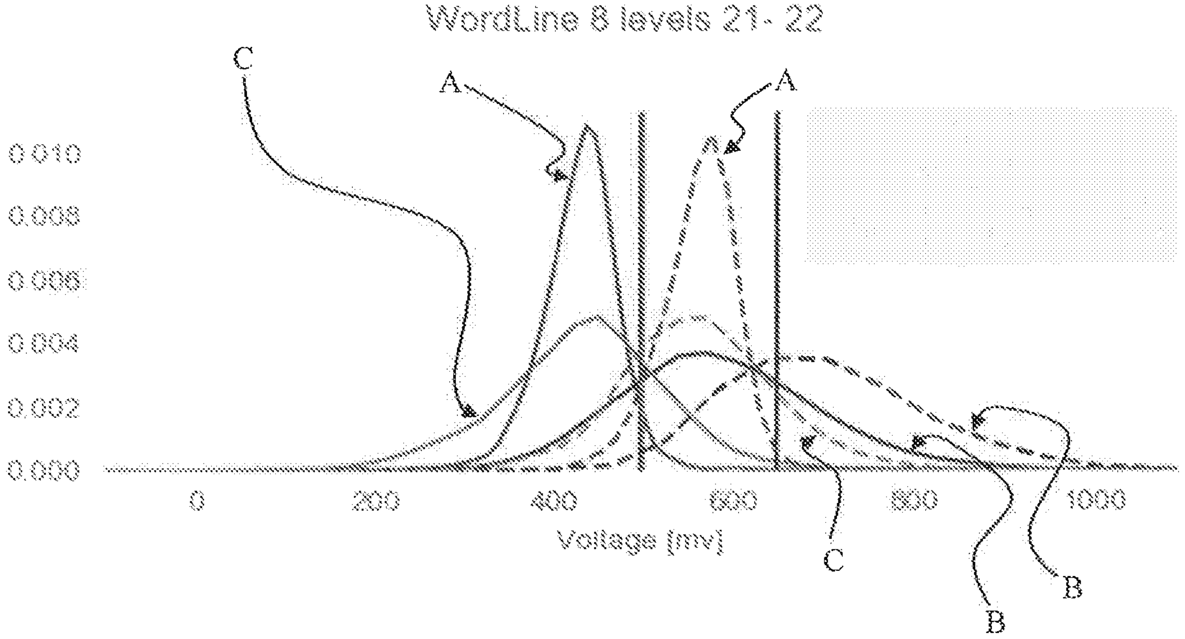
FIG. 11 is a graph illustrating the effects of performing noise cancellation on specific levels of a memory block, according to an exemplary embodiment of the inventive concept.

FIG. 10 is a graph illustrating results of performing noise cancellation on a memory device using a neural network, according to an exemplary embodiment of the inventive concept. FIG. 11 is a graph illustrating the effects of performing the noise cancellation on specific levels of a memory block, according to an exemplary embodiment of the inventive concept.

As can be seen in FIG. 10, in a test scenario, performing noise cancellation on a memory device using a neural network according to an exemplary embodiment of the inventive concept corrected some added noise and improved the overall raw BER of the noised data by about 14% to about 17%. For example, in FIG. 10, line A represents noised data having a mean BER of about 0.1779, line B represents the predicted data (e.g., the denoised data according to exemplary embodiments) having a mean BER of about 0.1478, and line C represents optimal data (e.g., data having no noise) having a mean BER of about 0.0735. The test results were obtained by testing different memory blocks of V2 NAND written using the 6 BPC scheme. An example of the effects of performing the noise cancellation on specific levels of the memory block is shown in FIG. 11.

FIG. 11 illustrates an example of two consecutive levels out of 64 levels in a word line (in a 6 BPC scheme) being denoised according to an exemplary embodiment. FIG. 11 illustrates the original (optimal) level distribution represented by line A, the noised distribution represented by line B, and the predicted (denoised) distribution represented by line C. FIG. 11 further illustrates the mean and standard deviation of word lines WL1 and WL2. It may be assumed that other levels behave similarly to the two levels illustrated in FIG. 11. In FIG. 11, the solid and dashed lines each represent one level (e.g., levels 21 and 22 of word line 8, respectively). The distributions are distributions of memory cell voltages per each level, and the vertical lines are the means. As can be seen in FIG. 11, in a test scenario, performing noise cancellation according to an exemplary embodiment corrects the level means back to their original voltage levels, and significantly reduces the deviation of the memory cell distribution of each level, even though noise may remain for the memory cells in the lowest levels, which are the levels most affected by the disturbances.

Figure 12:
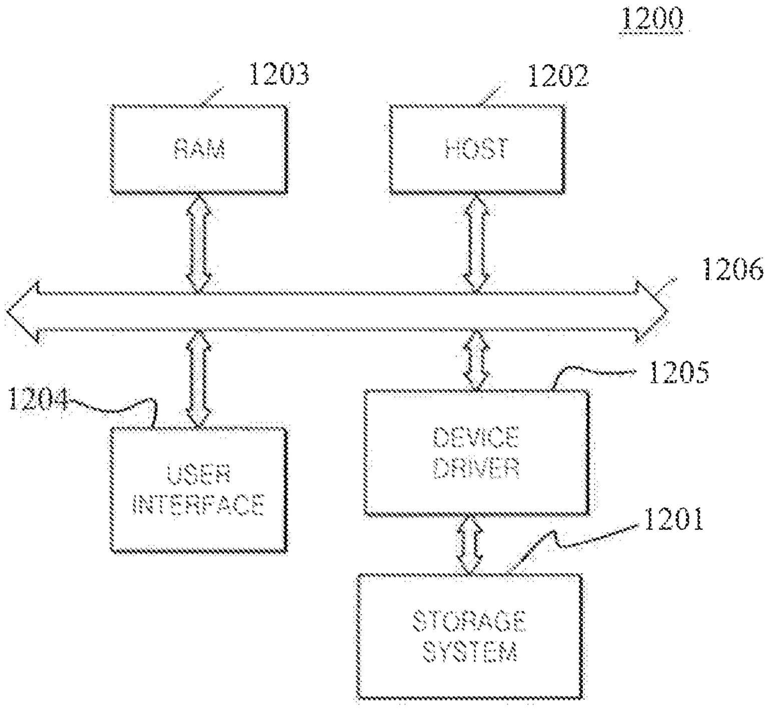
FIG. 12 is a block diagram of a computing system including a non-volatile memory system, according to an exemplary embodiment of the inventive concept.

FIG. 12 is a block diagram of a computing system 1200 including a non-volatile memory system, according to an exemplary embodiment of the inventive concept.

The non-volatile memory system in FIG. 12 may be the memory system 200 illustrated in FIG. 1. In the computing system 1200, which may be, for example, a mobile device or a desktop computer, the non-volatile memory system may be mounted as a non-volatile storage system 1201, however exemplary embodiments are not limited thereto.

The computing system 1200 may include, for example, a host 1202 including a CPU, a RAM 1203, a user interface 1204, and a device driver 1205. The host 1202 may be the host 100 illustrated in FIG. 1, and the device driver 1205 may be the memory device driver 111 illustrated in FIG. 1. These elements are electrically connected to a bus 1206. The non-volatile storage system 1201 may be connected to the device driver 1205. The host 1202 may control the entire computing system 1200 and perform an operation corresponding to a user command input through the user interface 1204. The RAM 1203 may function as a data memory of the host 1202. The host 1202 may write user data to or read user data from the non-volatile storage system 1201 through the device driver 1205. In FIG. 12, the device driver 1205 that controls the operation and management of the non-volatile storage system 1201 is illustrated as being disposed outside the host 1202, however exemplary embodiments are not limited thereto. For example, in an exemplary embodiment, the device driver 1205 may be disposed inside the host 1202.

In exemplary embodiments of the present inventive concept, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In exemplary embodiments of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the exemplary embodiments may be physically separated into two or more interacting and discrete blocks, units and/or modules without departing from the scope of the inventive concept. Further, the blocks, units and/or modules of the exemplary embodiments may be physically combined into more complex blocks, units and/or modules without departing from the scope of the inventive concept.

Exemplary embodiments of the present invention may be embodied directly in hardware, in a software module executed by a processor, or in a combination of the two. A software module may be tangibly embodied on a non-transitory program storage device such as, for example, in RAM memory, flash memory, ROM memory, EPROM memory, EEPROM memory, registers, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an application specific integrated circuit (ASIC).

While the present inventive concept has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A memory system, comprising:
- a memory device; and
- a memory controller comprising a processor and an internal memory,
- wherein the memory device operates under control of the memory controller, and a computer program comprising a neural network is stored in the internal memory of the memory controller or the memory device;
- wherein the processor is configured to execute the computer program to:
- (a) extract a voltage level from each of a plurality of memory cells connected to one string select line (SSL), wherein the memory cells and the SSL are included in a memory block of the memory device;
- (b) provide the voltage levels of the memory cells as input to the neural network; and
- (c) perform noise cancellation on the SSL, using the neural network, by changing a voltage level of an errant memory cell among the memory cells that is misclassified as a first cluster of the memory cells from a first voltage level corresponding to the first cluster to a second voltage level corresponding to a second cluster of the memory cells different from the first cluster.

2. The memory system of claim 1, wherein the processor is further configured to execute the computer program to:
- perform an effectiveness check during a training mode of the neural network, wherein performing the effectiveness check comprises:
- comparing a bit error rate (BER) of each of the memory cells before performing noise cancellation on the SSL with a BER of each of the memory cells after performing noise cancellation on the SSL.

3. The memory system of claim 2, wherein the processor is further configured to execute the computer program to:
- perform a level skip operation during an inference mode of the neural network, wherein performing the level skip operation comprises:
- identifying at least one memory cell for which the BER is not improved after performing noise cancellation on the SSL, based on the effectiveness check; and
- reverting a corresponding voltage level of the identified at least one memory cell to a value that the identified at least one memory cell had before performing noise cancellation on the SSL.

4. The memory system of claim 1, wherein the processor is further configured to execute the computer program to:
- perform data normalization on the voltage levels of the memory cells before noise cancellation has been performed on the SSL; and
- perform data de-normalization on the voltage levels of the memory cells after noise cancellation has been performed on the SSL.

5. The memory system of claim 1, wherein the processor is further configured to execute the computer program to:
- perform voltage level mean correction on the voltage levels of the memory cells before noise cancellation has been performed on the SSL.

6. The memory system of claim 1, wherein a number of the extracted voltage levels corresponds to a number of word lines connected to the SSL.

7. The memory system of claim 1, wherein the processor executes the computer program to perform operations (a) to (c) when the memory block is being read during a read operation of the memory device.

8. The memory system of claim 1, wherein each memory cell stores 6 bits, each memory cell has one of 64 possible states corresponding to 64 predefined voltage levels, and the SSL included in the memory block is one of four SSLs included in the memory block.

9. The memory system of claim 8, wherein the processor executes the computer program to perform operations (a) through (c) independently on each of the four SSLs included in the memory block.

10. The memory system of claim 8, wherein the first and second clusters are included among 64 clusters corresponding to the 64 predefined voltage levels.

11. The memory system of claim 1, wherein the neural network is stored on and executed on the memory device.

12. The memory system of claim 1, wherein the neural network is a residual neural network (ResNet).

13. The memory system of claim 1, wherein the neural network comprises:
- an input layer having a size corresponding to a number of the extracted voltage levels; and
- an output layer having a size corresponding to the number of the extracted voltage levels,
- wherein each layer in the neural network is a fully connected layer.

14. A method of performing noise cancellation on a memory device using a neural network, comprising:
- (a) extracting a voltage level from each of a plurality of memory cells connected to one string select line (SSL), wherein the memory cells and the SSL are included in a memory block of the memory device;
- (b) providing the voltage levels of the memory cells as input to the neural network; and
- (c) performing noise cancellation on the SSL, using the neural network, by changing a voltage level of an errant memory cell among the memory cells that is misclassified as a first cluster of the memory cells from a first voltage level corresponding to the first cluster to a second voltage level corresponding to a second cluster of the memory cells different from the first cluster.

15. The method of claim 14, further comprising:
- performing an effectiveness check during a training mode of the neural network, wherein performing the effectiveness check comprises:

comparing a bit error rate (BER) of each of the memory cells before performing noise cancellation on the SSL with a BER of each of the memory cells after performing noise cancellation on the SSL.

16. The method of claim 15, further comprising:

performing a level skip operation during an inference mode of the neural network, wherein performing the level skip operation comprises:

identifying at least one memory cell for which the BER is not improved after performing noise cancellation on the SSL, based on the effectiveness check; and reverting a corresponding voltage level of the identified at least one memory cell to a value that the identified at least one memory cell had before performing noise cancellation on the SSL.

17. The method of claim 14, further comprising:

performing data normalization on the voltage levels of the memory cells before performing noise cancellation on the SSL; and performing data de-normalization on the voltage levels of the memory cells after performing noise cancellation on the SSL.

18. The method of claim 14, further comprising:

performing voltage level mean correction on the voltage levels of the memory cells before performing noise cancellation on the SSL.

19. The method of claim 14, wherein a number of the extracted voltage levels corresponds to a number of word lines connected to the SSL.

20. The method of claim 14, wherein operations (a) to (c) are performed when the memory block is being read during a read operation of the memory device.

* * * * *